(12) United States Patent
Paci et al.

(10) Patent No.: US 12,354,998 B2
(45) Date of Patent: Jul. 8, 2025

(54) PACKAGED ELECTRONIC SYSTEM FORMED BY ELECTRICALLY CONNECTED AND GALVANICALLY ISOLATED DICE

(71) Applicant: STMICROELECTRONICS S.r.l., Agrate Brianza (IT)

(72) Inventors: Dario Paci, Vittuone (IT); Silvia Adorno, Novate Milanese (IT); Marco Del Sarto, Monza (IT); Fabrizio Cerini, Magenta (IT); Alex Gritti, Vimercate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 32 days.

(21) Appl. No.: 17/580,480

(22) Filed: Jan. 20, 2022

(65) Prior Publication Data
US 2022/0238485 A1 Jul. 28, 2022

(30) Foreign Application Priority Data
Jan. 27, 2021 (IT) .................. 102021000001637

(51) Int. Cl.
*H01L 25/065* (2023.01)
*H01L 23/00* (2006.01)
*H01L 23/538* (2006.01)
*H01L 23/64* (2006.01)

(52) U.S. Cl.
CPC ...... *H01L 25/0652* (2013.01); *H01L 23/5384* (2013.01); *H01L 23/5386* (2013.01); *H01L 23/642* (2013.01); *H01L 24/14* (2013.01)

(58) Field of Classification Search
CPC . H01L 2924/15313; H01L 2924/15323; H01L 2924/15333
See application file for complete search history.

(56) References Cited

U.S. PATENT DOCUMENTS

| | | | |
|---|---|---|---|
| 7,218,006 B2 * | 5/2007 | Kang | H01L 25/0657 257/784 |
| 11,264,359 B2 * | 3/2022 | Hsu | H01L 21/4857 |
| 2009/0168391 A1 | 7/2009 | Saitou et al. | |
| 2011/0298139 A1 | 12/2011 | Lai et al. | |
| 2013/0168854 A1 | 7/2013 | Karikalan et al. | |
| 2015/0116965 A1 * | 4/2015 | Kim | H01L 23/5385 361/767 |
| 2020/0321275 A1 | 10/2020 | Haba et al. | |
| 2021/0066254 A1 * | 3/2021 | Yu | H01L 24/73 |
| 2021/0366800 A1 * | 11/2021 | Lee | H01L 23/31 |
| 2021/0375707 A1 * | 12/2021 | Teixeira De Queiros | H01L 23/315 |

FOREIGN PATENT DOCUMENTS

WO  WO 9724740 A1  7/1997

* cited by examiner

*Primary Examiner* — Phat X Cao
(74) *Attorney, Agent, or Firm* — Seed IP Law Group LLP (57) ABSTRACT

A packaged electronic system having a support formed by an insulating organic substrate housing a buried conductive region that is floating. A first die is fixed to the support and carries, on a first main surface, a first die contact region capacitively coupled to a first portion of the buried conductive region. A second die is fixed to the support and carries, on a first main surface, a second die contact region capacitively coupled to a second portion of the buried conductive region. A packaging mass encloses the first die, the second die, the first die contact region, the second die contact region, and, at least partially, the support.

20 Claims, 5 Drawing Sheets

PACKAGED ELECTRONIC SYSTEM FORMED BY ELECTRICALLY CONNECTED AND GALVANICALLY ISOLATED DICE

BACKGROUND

Technical Field

The present disclosure relates to a packaged electronic system formed by electrically connected and galvanically isolated dice.

Description of the Related Art

Electronic systems where the dice are packaged in a package and integrate electronic devices (components and/or circuits) configured to work at very different voltages and to exchange signals with each other. For instance, the electronic systems may be a power-supply system, a digital isolator, a power transistor driving system, a DC-DC converter, or other system where at least one of the devices operates at high voltage (even higher than 10 kV) and/or high power. For these systems, it is known to include measures for maintaining an adequate isolation galvanic between the various devices.

In particular, packages dedicated to providing a high isolation level are mainly based upon two approaches:

two-dice approach, where two dice integrate each a respective "functional" device and a respective (capacitive or inductive) isolation element and the two isolation elements are connected together; and three-dice approach, comprising an isolation device integrated in a die connected to the two "functional" devices (e.g., two other die).

Figure 1:
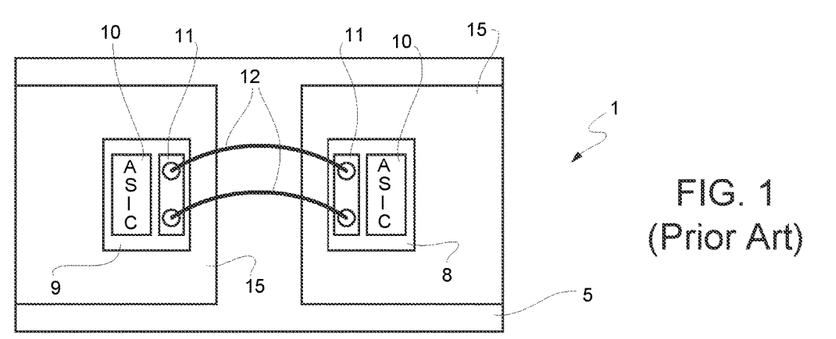
FIG. 1 is a top view, simplified and with the package shown in phantom, of a known system of devices.
Figure 2:
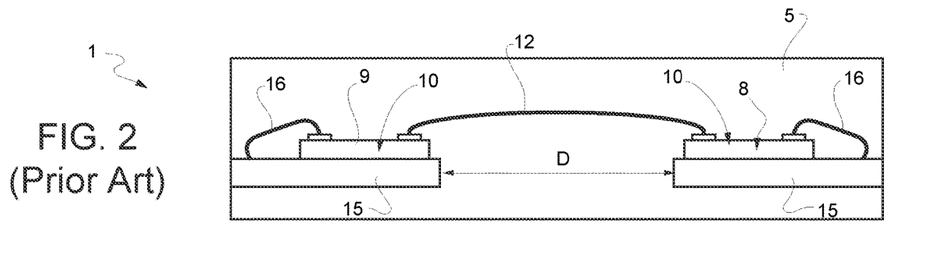
FIG. 2 is a cross-sectional side view of the system of FIG. 1, with the package shown in phantom.

The two-dice approach is shown, for example, in FIGS. 1 and 2 of the present disclosure. Here a package 5 of resin or other insulating material encloses a system comprising two dice 8, 9 integrating a respective electronic circuit 10 and a respective isolation element 11. For instance, the circuits 10 may be ASICs (Application-Specific Integrated Circuits); alternatively, one or both circuits 10 may integrate individual electronic components and/or be formed by different circuits.

The circuits 10 are connected to the respective isolation elements 11 through buried or surface connections, not shown; the isolation elements 11 in the dice 8, 9 are connected by connection wires 12.

The dice 8, 9 are each fixed to a respective supporting element 15 that is part of a leadframe for connecting different terminals of the circuits 10 to the outside, in a per se known manner. Bonding wires 16 connect the terminals of the circuits 10 to the respective leadframe 15, and the package 5 embeds the dice 8, 9, the wires 12, 16 and part of the leadframe 15 so as to electrically isolate them and protect them from the external environment.

The two-dice approach is intrinsically robust as regards parasitic elements, since the connection wires 12 are just a few, are short, and are arranged in a less critical position (downstream of the isolation elements 11), but, in some applications, may be far from flexible. In fact, the designer has only a few degrees of freedom in the design of the isolation elements, being constrained to the technologies and platforms for manufacturing the circuits 10. In particular, with this approach, the designer is not always able to use the most advanced approaches and knowledge and frequently cannot use the same isolation elements when the circuits 10 of the dice 8, 9 are manufactured using different technologies.

Figures 3, 4:
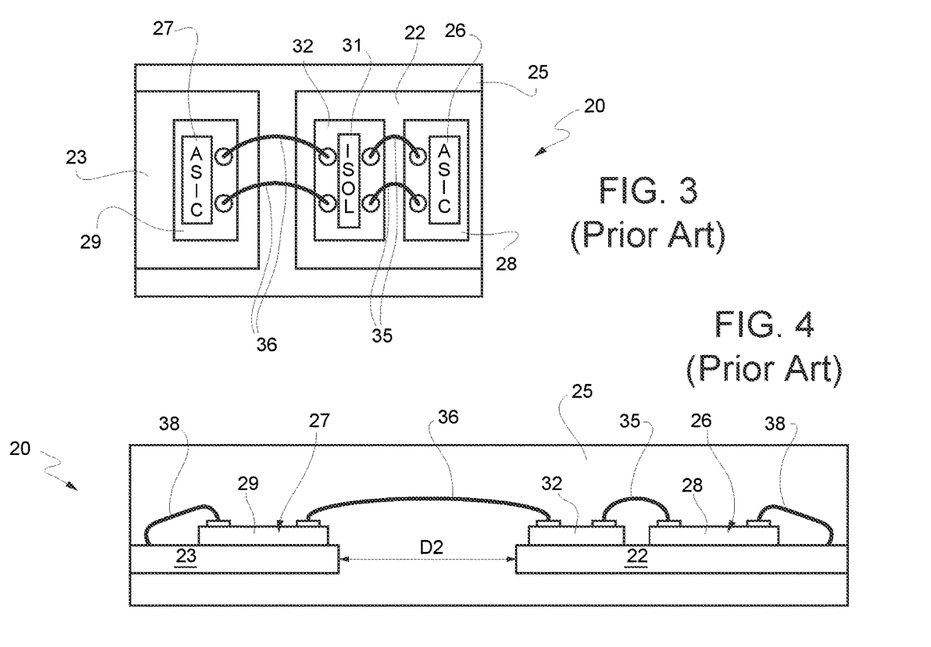
FIG. 3 is a top view, simplified and with the package shown in phantom, of another known system of devices.
FIG. 4 is a cross-sectional side view of the system of FIG. 3, with the package shown in phantom.

The three-dice approach is shown, for example, in FIGS. 3 and 4. Here a package 25 of resin or other insulating material encloses a system formed by two "operative" dice (first and second die 28, 29). The dice 28, 29 integrate each an electronic circuit or component 26 and 27, respectively, and are fixed to a respective leadframe 22, 23, also here shown in a simplified way. The isolation element, designated by 31, is integrated in a third die 32 fixed on one of the two leadframes, here on the leadframe 22 carrying the first die 28.

The first circuit 26 is connected to the isolation element 31 through first connection wires 35, and the second circuit 27 is connected to the isolation element 31 through second connection wires 36, generally longer than the first connection wires 35.

Bonding wires 38 connect the terminals of the circuits 26, 27 to the respective leadframes 22, 23, and the package 25 embeds the dice 28, 29, 32, the wires 35, 36, 38, and part of the leadframes 22, 23.

The three-dice approach is very flexible and enables use of isolation optimized platforms, irrespective of the technology used for the circuits 26, 27. However, this approach has parasitic components due to the first connection wires 35 and, in particular, the second connection wires 36, which can cause problems of cross-talk, i.e., interference between the signal-transmission channels.

Other possibilities for mutually insulating the devices arranged in a single package include arranging high-value capacitances within one or both devices. However, not even these approaches are altogether satisfactory and/or can be applied to all systems. In fact, the provision of shielding coatings cannot be used for wires of small dimensions and is subject to problems of repeatability, so that it is far from effective. The use of high capacitances is not moreover always possible since they cause an increase in power consumption of the system and can reduce the bandwidth usable for the communications.

BRIEF SUMMARY

The present disclosure provides a solution that overcomes the drawbacks of the conventional packages and structures as discussed above.

According to the present disclosure a packaged electronic system is provided.

For example, in at least one embodiment, a package electronic system includes a support, the support comprising an insulating organic substrate housing a buried conductive region, the buried conductive region being a floating region and having a first and a second portion mutually spaced; a connection pad on the support; a first die, fixed to the support, the first die having a first main surface carrying a first die contact region capacitively coupled to the first portion of the buried conductive region; a second die, fixed to the support, the second die having a first main surface carrying a second die contact region, capacitively coupled to the second portion of the buried conductive region; a first and second external connection regions mutually spaced; a connection line coupled to the connection pad and to at least one of the first and second external connection regions to couple at least one of the first and second die to at least one of the first and second external connection regions; and a packaging mass enclosing the first die, the second die, the first die contact region, the second die contact region, and, at least partially, the support

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

In the following description, reference will be made to a system formed by two dice, integrating each an ASIC (Application-Specific Integrated Circuit), but the disclosure applies to electronic devices of any type, whether single components or more complex circuits, operating at different voltages, even having a very different value, in common mode.

Figure 5A:
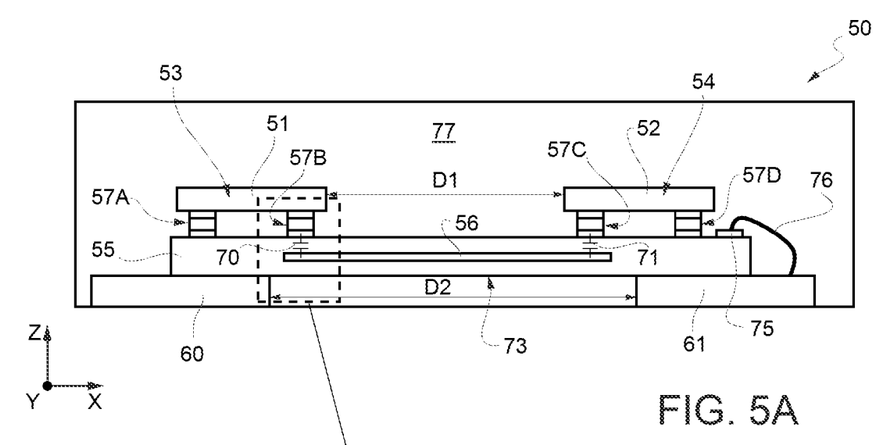
FIG. 5A is a cross-sectional side view of an embodiment of the present system of devices, with the package shown in phantom.

FIG. 5A shows a system 50 comprising two dice 51, 52 integrating each an own device 53, 54. The devices 53, 54 are here both ASICs, as indicated above. The two dice are spaced apart from each other by a distance D1 as shown in FIG. 5A. The distance D1 extends between respective sidewalls of the first die 51 and the second die 52.

The dice 51, 52 are both fixed to a support 55. The support 55 has, for example, a parallelepipedal shape having a first and a second main face 55A, 55B (see also the detail of FIG. 5B). The first and second main faces 55A, 55B may be referred to as surfaces (e.g., a first surface, a second surface, a first main surface, a second main surface, etc.). The first and second main faces 55A, 55B are opposite to each other such that the first main face 55A faces away from the second main face 55b and vice versa. The first and second main faces 55A, 55B here extend parallel to a plane XY of a Cartesian coordinate system XYZ; the support 55 moreover has a height (parallel to a third axis Z of the Cartesian coordinate system XYZ) that is smaller than the width and length (parallel to a first axis X and a second axis Y, respectively, of the Cartesian coordinate system XYZ). The support 55 may be referred to as an electrical connection element, an electrical connection structure, a capacitive electrical connection element, a capacitive electrical connection structure, or some other reference to the support 55 being configured to provide electrical connections such as capacitive electrical connections within embodiments of the systems, packages, or devices of the present disclosure.

The support 55 is an organic support, generally of insulating material. The support may house inside a buried conductive region 56, which may be readily seen in FIGS. 5A and 5B of the present disclosure. The buried conductive region 56 is completely surrounded by the insulating material of the support 55 so that there are no physical conductive connection paths with other parts of the system 50 (in other words, the buried conductive region 56 is floating).

For instance, the support 55 may be formed by a printed-circuit board (PCB). According to one embodiment, the support 55 is formed by a multilayer including a sequence of conductive layers, typically of metal, and by insulating layers, for example of organic plastic, and one of the conductive layers forms the buried conductive region 56, as described more fully hereinafter with reference to FIG. 6.

The buried conductive region 56 extends for a majority of the length of the support 55 (parallel to the first axis X); in particular, in the embodiment shown, it extends as far as underneath the dice 51, 52. In other words, the dice 51 overlap the buried conductive region 56 based on the orientation as shown in FIG. 5A.

Contact structures 57A-57D on the first face 55A of support 55 extend from the support 55 to the dice 51, 52 to form electrical connections to the dice 51, 52. For example, electrically conductive components within the dice 51, 52 are coupled to conductive components in the support 55 by the contact structures 57A-57D, respectively.

The contact structures 57A-57D are here formed by a bottom portion 65, for example formed by a support pad region, arranged on the first face 55A of the support 55; an intermediate portion 66, forming a bump region, here arranged on the bottom portion 65; and a top portion 67, for example formed by a die pad region, here arranged on the intermediate portion 66 and formed, from example, by respective top metal layers of the dice 51, 52, in a per se known manner. The bottom portion 65 may be referred to as a lower portion or some other reference to the bottom portion 65 at the first face 55A of the support 55. The intermediate portion 66 may be referred to as a central portion, a middle portion, or some other reference to the intermediate portion 66 between the bottom portion 65 and the top portion 67, respectively. The top portion 67 may be referred to as an upper portion or some other reference to the top portion 67 at a respective surface of one of the dice 51, 52 that faces towards the first face 55A of the support 55. The bottom portion 65, the intermediate portion 66, and the top portion 67 may be referred together as a standoff.

The top portions 67 of the contact structures 57A-57D are electrically connected to the electrical components of the devices 53, 54, in a known way.

Two contact structures, referred to hereinafter as first and second contact structures 57A, 57B, connect the first die 51 to the support 55, and two other contact structures, designated hereinafter as third and fourth contact structures 57C, 57D, connect the second die 52 to the support 55.

In particular, here, the bottom portions 65 of the second and third contact structures 57B, 57C extend vertically on a respective longitudinal end of the buried conductive region 56 and are thus capacitively coupled thereto. Consequently, in this embodiment the bottom portions 65 of the second and third contact structures 57B, 57C form first plates of capacitive elements having a common counterplate formed by the buried conductive region 56. In this embodiment, then, the bottom portions 65 are also referred to as first plates 65, and the buried conductive region 56 is also referred to as common floating plate 56.

In other words, a first capacitor 70 is formed between the second contact structure 57B and the buried conductive region 56, and a second capacitor 71 is formed between the third contact structure 57C and the buried conductive region 56. The first and second capacitors 70, 71 are arranged in series to each other through the buried conductive region 56, thereby providing a galvanic-coupling structure 73 between the first and second dice 51, 52, as discussed in detail hereinafter.

The first and fourth contact structures 57A, 57D, (as well as other possible contact structures, not shown) connect the respective dice 51, 52 electrically to further support pad regions on the support 55, in a way not shown but known to the person skilled in the art.

In FIG. 5A, a first and a second external connection region 60, 61 are fixed to the second main face 55B of the support 55. The first and second external connection regions 60, 61 may be referred to as external contact regions.

The external connection regions 60, 61 here implement an LGA (Land Grid Array) connection scheme and form part, in a known way, of a leadframe formed by distinct external connection regions, electrically isolated from each other, which enable electrical connection of the system 50 to the outside (e.g., external to the system 50). In particular, the shown external connection regions 60, 61 are configured so as to be able to work at voltages very different from each other and/or from operating voltages of one or both of the devices 53, 54, even up to 10 kV. To this end, the external connection regions 60, 61 are spaced apart by a distance D2 that extends between respective sidewalls of the external connection regions 60, 61, and, in this embodiment, the external connection regions 60, 61 are fixed to the support 55 so as not to vertically overlap the buried conductive region 56.

In FIG. 5A, a further pad region 75 extends on the first face 55A of the support 55. The further pad region 75 may be provided in the same layer as the first plates 65, in a way known to the person skilled in the art, and is connected to the second external connection region 61 by an electrical connection wire 76. The first plates 65 may be coupled to the pad region 75.

A packaging mass 77, of resin or other insulating material, encloses the dice 51, 52, the support 55, the electrical connection wire 76, and a most of the external connection regions 60, 61. The packaging mass 77 may be an encapsulant, a molding compound, a epoxy, a resin, or some other type of material for encasing the various components of the systems, packages, or devices of the present disclosure.

In practice, in the system 50 of FIG. 5A, the capacitors 70, 71 provide a galvanic transmission channel between the devices 53, 54 enabling transmission of common mode signals between (e.g., to and from) the devices 53, 54.

This channel can be used as single transmission channel, according to the devices 53, 54, the specific exchanged signals, and the design choices. Alternatively, the system 50 may include a plurality of such channels, each for a respective signal to be exchanged and/or a transmission direction, as discussed in detail hereinafter.

In the system 50 of FIG. 5A, to obtain the isolation, and according to the specific operating voltages, some distance ratios are important, as discussed hereinafter, based on the first die 51 may operate at a much higher voltage than the first external connection region 60.

Figure 5B:
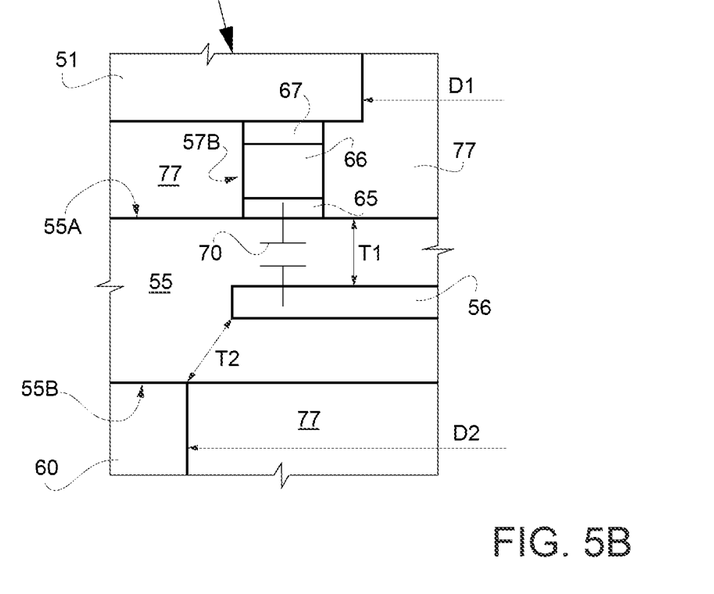
FIG. 5B shows an enlarged detail of FIG. 5A.

In particular, with reference to FIGS. 5A and 5B, the distance D2 between the external connection regions 60, 61 is chosen to be greater than the distance D1 between the dice 51, 52.

Furthermore, a distance T1 (FIG. 5B) between the second contact structure 57B and the buried conductive region 56 and a distance T2 between the buried conductive region 56 and the first external connection region 60 are chosen, to take into account the isolation characteristics of the material of the support 55 and other possible criteria known to the designer. For instance, if the material of the insulating layers forming the support 55 is the same, with the same dielectric strength, the distances T1 and T2 may be equal (T1=T2). Vice versa, if the bottom portion (in FIG. 5B) of the support 55 is of a material able to withstand higher electrical fields than the material interposed between the buried conductive region 56 and the first plate 65 (bottom portion of the second contact structure 57B), T1 may be higher than T2 (T1>T2).

Similar considerations may be applied to the distance between the third contact structures 57C and the buried conductive region 56 and to the distance between the buried conductive region 56 and the second external connection region 61, in case of large voltage differences.

Figure 6:
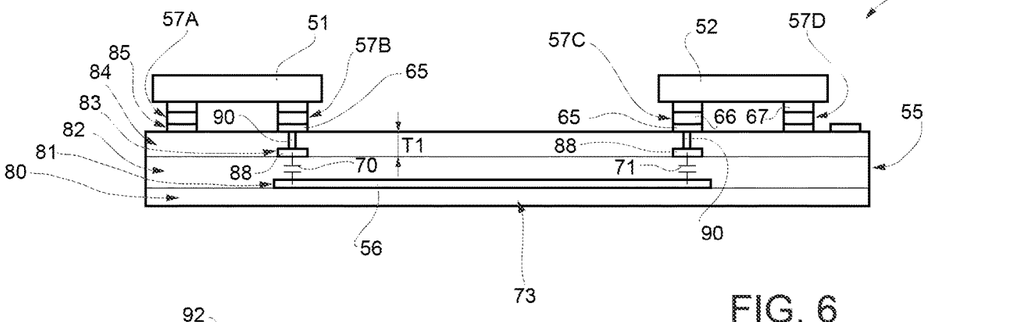
FIG. 6 is a cross-sectional side view of an implementation of a portion of the present system of devices, at an enlarged scale.

FIG. 6 shows a possible implementation of the support 55.

In detail, the support 55 of FIG. 6 is manufactured starting from a board of a commercially available type, formed by a multilayer. In particular, here the support 55 comprises a bottom insulating layer 80; a bottom conductive layer 81, overlying the bottom insulating layer 80; an intermediate insulating layer 82, the so called core, overlying the bottom insulating layer 80 and the bottom conductive layer 81; a top conductive layer 83, overlying the intermediate insulating layer 82; a top insulating layer 84, overlying the intermediate insulating layer 82 and the top conductive layer 83; and a top conductive layer 85, overlying the top insulating layer 84. These various layers of the support 55 may be referred to as a first layer, a second layer, a third layer, a fourth layer, a fifth layer, and so forth.

The insulating layers 80, 82, 84 may be of organic material, for example plastic, such as so-called insulating prepeg; the conductive layers 81, 83 and 85 may be of metal, such as copper. Possibly, the top conductive layer 83 may further comprise a layer with very low contact resistance, for example a gold-based layer, overlying the copper layer.

The conductive layers 81, 83 and 85 are shaped to form, respectively, the buried conductive region 56, the top plate regions 88 of the capacitors 70, 71, and the bottom portions 65 of the second and third contact structures 57B, 57C.

Figure 12:
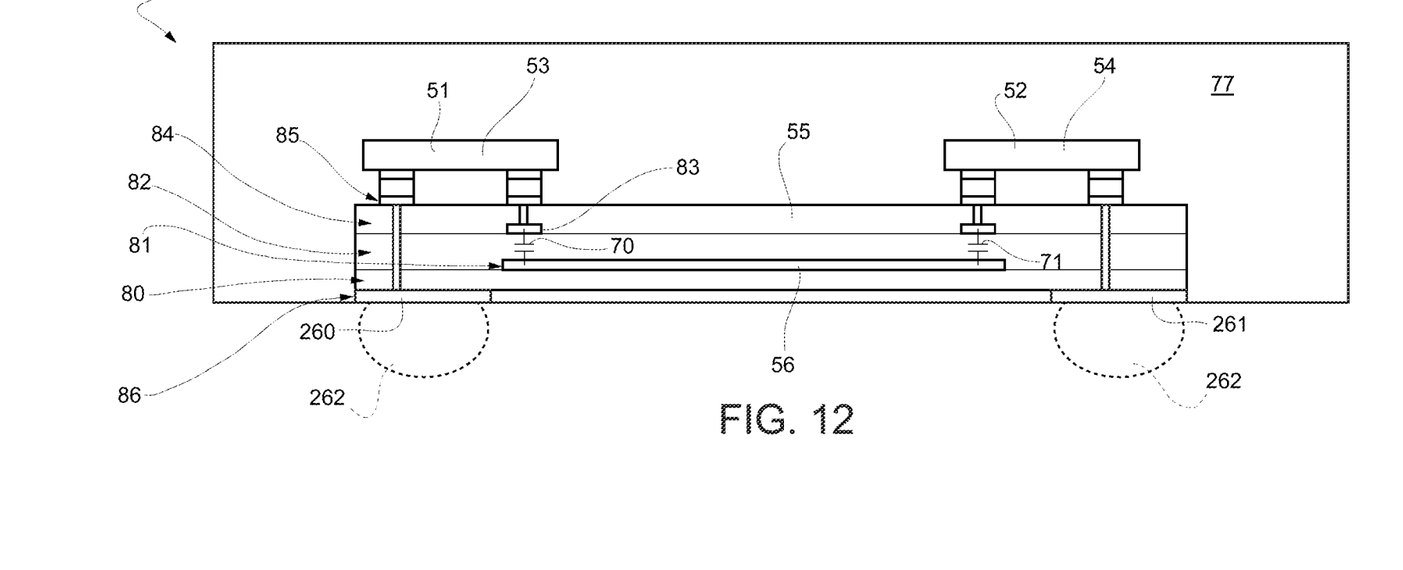
FIG. 12 is a cross-sectional side view of a different embodiment of the present system of devices, with the package shown in phantom.

In a way not shown, the support 55 may comprise a bottom conductive layer, arranged underneath the bottom insulating layer 80 and also of metal, such as copper, possibly coated with a gold-based layer (see also the description of FIG. 12).

In practice, here the capacitors 70, 71 are formed by the bottom conductive layer 81 (buried conductive region 56), the intermediate insulating layer 82, and the top conductive layer 83 (top plate regions 88). Consequently, in this embodiment, the bottom portions 65 of the contact structures 57A-57D no longer form plates of the capacitors 70, 71, but are connected to the top plate regions 88 by respective vias 90 extending through the top insulating layer 84.

In this embodiment, the critical distance T1, to be compared with the distance T2 between the buried conductive region 56 and the first external connection region 60, is the one between the bottom portion 65 of the second contact structures 57B and the top plate region 88 facing it.

Figure 7:
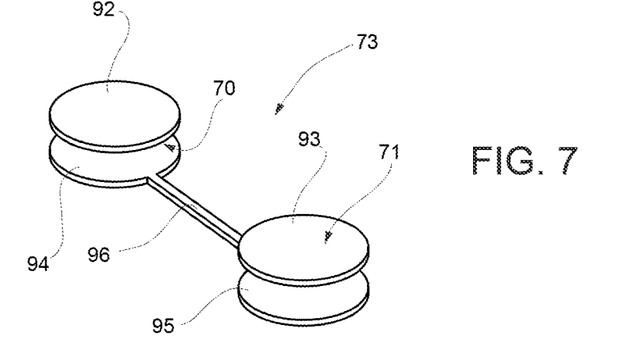
FIG. 7 is a perspective view of an implementation of a part of the present system of devices, at an enlarged scale.

FIG. 7 shows a possible embodiment of the galvanic-coupling structures 73.

In detail, here, a first and a second disk-shaped plate 92, 93 form the bottom portions 65 of FIG. 5A or the top plate regions 88 of FIG. 6 of the first capacitor 70 and second capacitor 71, respectively. A third and a fourth disk-shaped plate 94, 95 form the ends of the buried conductive region 56 of the first and second capacitors 70, 71.

The third and fourth disk-shaped plates 94, 95 are here vertically aligned to the first disk-shaped plate 92 and the second disk-shaped plate 93, respectively. In other words, as shown in FIG. 7, the first disk-shaped plate 92 is aligned with and overlaps the third disk-shaped plate 94, and, as shown in FIG. 7, the second disk-shaped plate 93 is aligned with and overlaps the fourth disk-shaped plate 95.

A conductive line 96 forms the buried conductive region 56 and directly connects or couples the third and fourth disk-shaped plates 94, 95 together. The conductive line 96 electrically couples the third and fourth disk-shaped plates 95, 96 together. The conductive line 96 may be referred to as a connection line, an electrical connection line, or some other type of line that electrically couples the third and fourth disk-shaped plates 95, 96 together. The conductive line 96 is integral the first and second disk-shaped plates 95, 96.

The size and shape of the disk-shaped plates 92-95 and of the conductive line 96 may be decided by the designer on the basis of the isolation voltages and of the materials used to prevent electrical field accumulation areas (tip effect) and in general to minimize the maximum electrical field at the specific operating voltage. In particular, in a way known to the person skilled in the art, the geometrical characteristics are studied to provide values for the active capacitance and for the active capacitance/parasitic capacitance ratio and to minimize peeling or failure risks during thermal cycles to which the device may be subjected during manufacture or normal use.

For instance, the system 50 may be configured to allow one of the devices 53, 54 or both (but not simultaneously) to operate at a high voltage (e.g., 10 kV or higher). In this case, the disk-shaped plates 92-95 may have a diameter comprised between 100 μm and 1 mm, in particular 400 μm, and the conductive line 96 may have a length comprised between 500 μm and 3 mm, in particular 1 mm, and a width comprised between 5 and 100 μm, in particular 30 μm. The diameter may be equal the upper and lower limits as set forth directly above.

The system 50 may comprise a number of galvanic-coupling structures 73, according to the needs.

Figure 8:
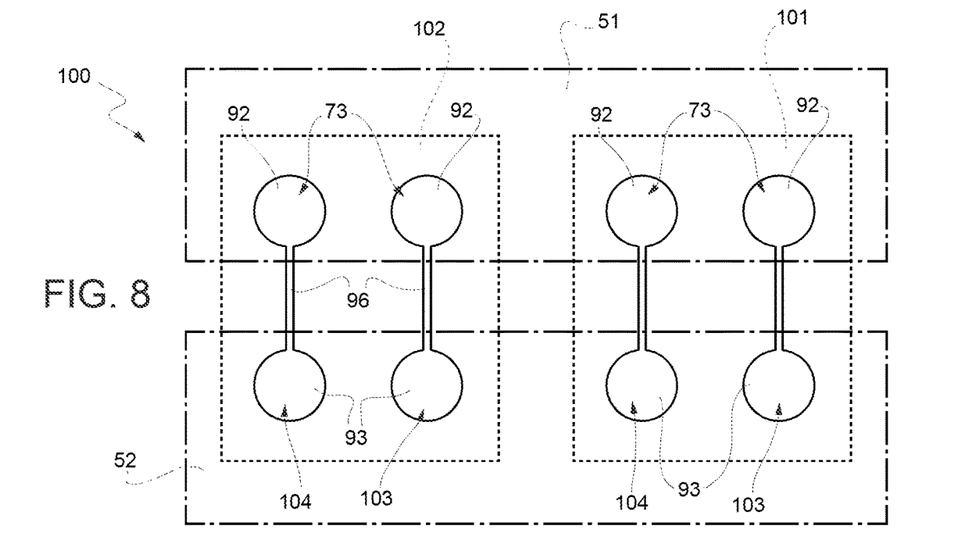
FIG. 8 shows the layout of an implementation of a part of the present system of devices.

For instance, FIG. 8 shows a system 100 comprising four galvanic-coupling structures 73 forming two transmission channels 101, 102, each having a respective pair of capacitances for differential transmission of the signals. In each transmission channel, the signals are, for example, transmitted by the first die 51 as potential difference between two first disk-shaped plates 92 and received by the second die 52 as potential difference between two second disk-shaped plates 93, in case of transmission from the first die 51 to the second die 52, and vice versa in the transmission of signals from the second die 52 to the first die 51.

Figure 9:
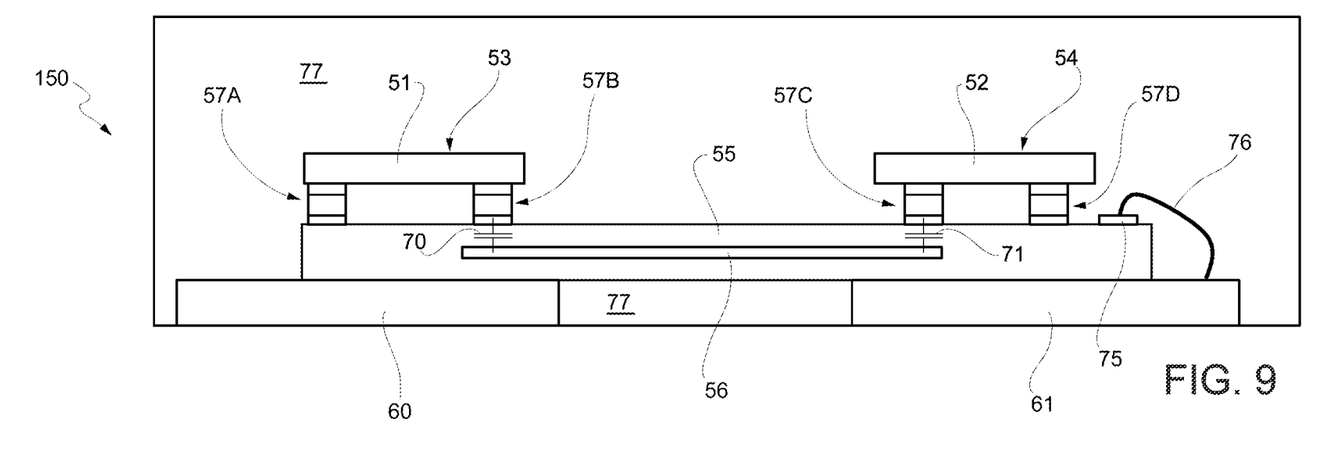
FIG. 9 is a cross-sectional side view of another embodiment of the present system of devices, with the package shown in phantom.

FIG. 9 shows a system 150 similar to the system 50 of FIG. 5A. Consequently, the system 150 will be described only with reference to the differences, using the same reference numbers for same parts.

The system 150 of FIG. 9 again comprises two dice 51, 52 fixed to a support 55 housing a buried conductive region 56, but the latter overlies in part the external connection regions 60, 61, so that the capacitors 70, 71 are arranged vertically aligned above the external connection regions 60, 61. In this case, for example, the distance between the external connection regions 60, 61 may be 500 μm, but the thickness of the support 55 is to be chosen with a sufficient value, higher than for the system 50 of FIG. 5A.

Figure 10:
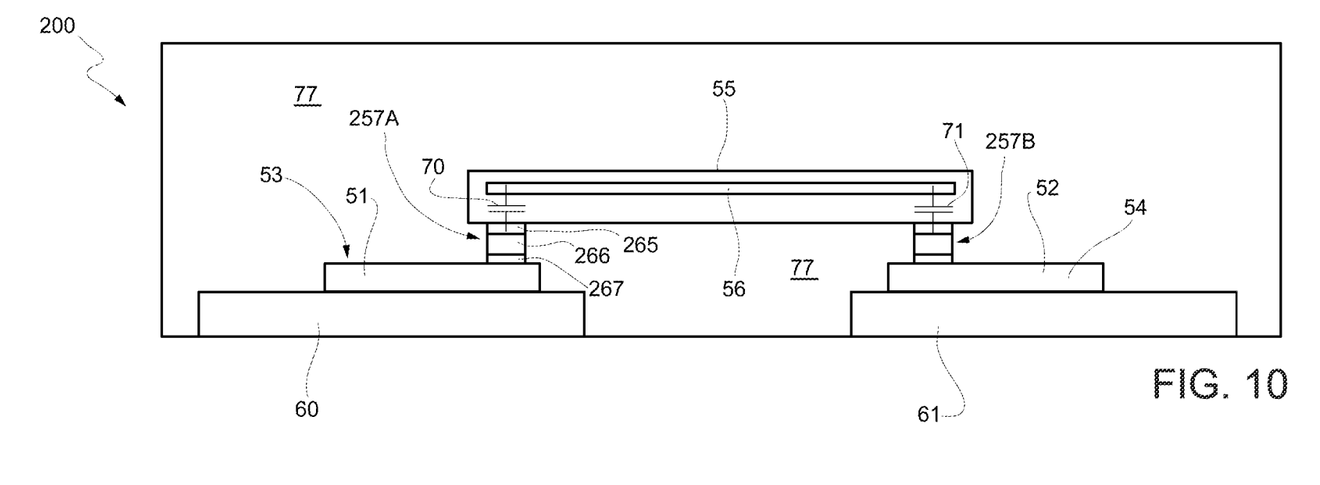
FIG. 10 is a cross-sectional side view of a different embodiment of the present system of devices, with the package shown in phantom.

In the system 200 of FIG. 10, the support 55 is arranged on the dice 51, 52.

In detail, here the dice 51, 52 are fixed directly to a respective external connection region 60, 61, a first contact structure 257A extends between the first die 51 and the support 55, and a second contact structure 257B extends between the first die 51 and the support 55. In practice, the dice 51, 52 are fixed to the respective external connection regions 60, 61, on a first main surface thereof and to the support 55, on a second main surface thereof, opposite to the first main surface.

The contact structures 257A, 257B may be formed in a similar way to the contact structures 57A-57D described above, and thus here comprise each a bottom portion 267, for example formed by a die pad, metal region; an intermediate portion 266, forming a bump region, here arranged on the bottom portion 267; and a top portion 265, for example formed by a support pad region, of metal, here arranged on the intermediate portion 266.

The top portions 265 of the contact structures 257A, 257B face respective ends, of the buried conductive region 56; the ends may be disk-shaped (as shown in FIG. 7). Here, then, the top portions 265 of the contact structures 257A, 257B form plate regions, capacitively coupled to the buried conductive region 56, to form the capacitors 70, 71.

Alternatively, in a way similar to what shown in FIG. 6 for the system 50, the contact structures 257A, 257B may be connected by vias to respective conductive regions (not shown) formed in the support 55 and facing the ends of the buried conductive region 56.

In the system 200 of FIG. 10, the length of the buried conductive region 56 may be comprised between 0.5 and 3 mm in the case of a distance between the external connection regions 60, 61 of 0.5 mm.

The system 200 of FIG. 10 has the advantage that, to obtain the isolation, is sufficient to satisfy the sealing constraint for the distance T1 between the second contact structure 57B and the buried conductive region 56 (and/or the third contact structure 57C and the buried conductive region 56), since the condition on the distance T2 (i.e., floating with respect to the external connection regions 60, 61) is automatically satisfied.

Figure 11:
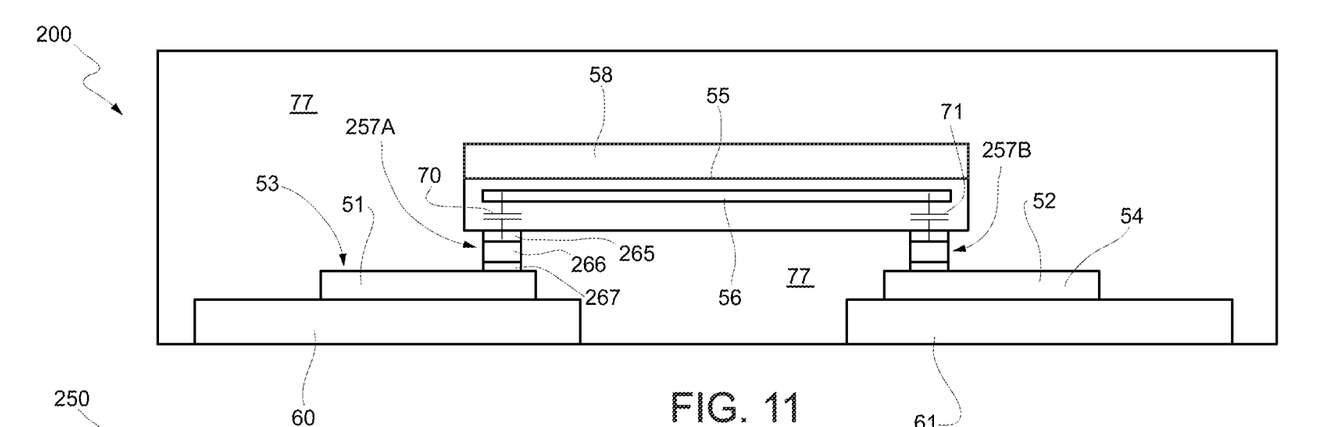
FIG. 11 is a cross-sectional side view of yet another embodiment of the present system of devices, with the package shown in phantom.

According to a different embodiment, shown in FIG. 11, a substrate 58 of semiconductor material extends on the support 55 of the system 200 of FIG. 10 and forms a die 59 with the support 55. In this case, the support 55 may be formed by insulating layers of polyimide and/or oxide housing metals to form the buried conductive region 56 and the top portions 265 of the contact structures 257A, 257B.

In this way, the system 200 may be obtained using techniques of the semiconductor industry, with consequent advantages in terms of resolution, spatial dimensions control and alignment.

FIG. 12 shows a system 250 similar to the system 50 of FIG. 5A.

In the system 250, the external connection regions 60, 61 are missing, and a bottom metal layer 86 of the support 55 extends underneath the bottom insulating layer 80. The bottom metal layer 86 is here shaped so as to form leads (of which two leads 260, 261 are shown, similar to the external connection regions 60, 61) for external connection of the devices 53, 54.

The system 250 of FIG. 12 may have a finishing of the BGA (Ball Grid Array) type with the balls of solder paste 262 (shown dashed) remolten on the leads 260, 261.

The systems 50, 100, 150, 200 and 250 described herein have a high isolation level between the devices even operating at very different, high voltages. These systems moreover give rise to parasitic elements of very low value.

They ma be manufactured in a simple way, using machines and steps ordinary in the production of power devices.

Finally, it is clear that modifications and variations may be made to the system described and shown herein, without departing from the scope of the present disclosure, as defined in the attached claims. For instance, the different described embodiments may be combined so as to provide further solutions.

Moreover, even though the shown systems comprise only two devices, the same solution may be applied in the case of a plurality of devices, possibly with adequate spacing of the buried conductive regions 56.

A packaged electronic system may be summarized as including a support (55), the support comprising an insulating organic substrate housing a buried conductive region (56), the buried conductive region being a floating region and having a first and a second portion (94; 95) mutually spaced; a first die (51), fixed to the support, the first die having a first main surface carrying a first die contact region (67; 267) capacitively coupled to the first portion of the buried conductive region; a second die (52), fixed to the support, the second die having a first main surface carrying a second die contact region (67; 267), capacitively coupled to the second portion of the buried conductive region; and a packaging mass (77) enclosing the first die (51), the second die (52), the first die contact region, the second die contact region, and, at least partially, the support (55).

The buried conductive region (56) may have an elongated shape with a first end and a second end, wherein the first portion (94) of the buried conductive region is arranged at the first end and the second portion (95) of the buried conductive region is arranged at the second end of the buried conductive region.

The first and second ends (94; 95) of the buried conductive region (56) may be disk-shaped.

The first and second die contact regions (67; 267) may face the first and, respectively, the second portions (94; 95), of the buried conductive region (56).

The support (55) may have a first and a second face (55A, 55B), the first and second dice (51, 52) being fixed to the first face (55A) of the support.

The system may include a first and a second external connection region (60, 61) of metallic material, the first and second external connection regions extending on the second face (55B) of the support (55) at a first mutual distance (D2), the external connection regions being electrically connected by connection lines (76) to the first and second dice (51, 52).

The first and second dice (51, 52) may be arranged at a second mutual distance (D1), wherein the first distance (D2) is greater than the second distance.

The first and second dice (51, 52) may be arranged at a second mutual distance (D1), wherein the first distance (D2) is smaller than the second distance.

The system may further include a first and a second contact structure (57B, 57C), wherein: the first contact structure (57B, 57C) comprises a first plate region (65), capacitively coupled to the first portion (94) of the buried conductive region (56) and arranged on the first face (55A) of the support (55); and a first bump region (66), contiguous to the first plate region and to the first die contact region, and the second contact structure comprises a second plate region (65), capacitively coupled to the second portion (95) of the buried conductive region (56) and arranged on the first face (55A) of the support (55); and a second bump region (66), contiguous to the second plate region and to the second die contact region.

The distance (T1) between the buried conductive region (56) and the first face (55A) of the support (55) may be equal to or smaller than the distance (T2) between the buried conductive region (56) and the first external connection region (57B).

The first and second dice may have a respective second main surface, the first and second dice (51, 52) being fixed to the support (55) on the respective first main surface and to a respective external connection region (60, 61), of metal, on the respective second main surface.

The support (55) may be a multilayer formed by a plurality of conductive layers including at least a first, a second and a third conductive layer (81, 83, 85) spaced apart by respective insulating layers (82, 84), the buried conductive region (56) may be formed in the first conductive layer (81) of the plurality of conductive layers, a first and a second capacitive plate region (88) may be formed in the second conductive layer (83) and directly face the first and, respectively, the second portions (94, 95) of the buried conductive region (56), and a first and a second support contact region (65; 265) may be formed in the third conductive layer (85) and may be electrically connected to the first and, respectively, the second capacitive plate regions (88), through vias (90) extending across a respective insulating layer (84).

The first and second support contact regions (65; 265) may be part of a first and, respectively, a second contact structure (57B, 57C; 257A, 257B), the first contact structure (57B; 257A) may further include a first bump region (66; 266) contiguous to the first support contact region (65; 265) and to the first die contact region (67; 267), and the second contact structure (57C; 257B) may further include a second bump region (66; 266) contiguous to the second support contact region (65; 265) and to the second die contact region (67; 267).

The distance (T2) between the buried conductive region (56) and the first external connection region (57B) may be approximately equal to the distance (T1) between the buried conductive region (56) and the first capacitive plate region (88).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a support including an insulating substrate having:
a first face and a second face opposite to the first face;
a first insulating layer including the second face;
a second insulating layer on the first insulating layer;
a third insulating layer on the second insulating layer including the first face;
a buried conductive region within the second insulating layer including a first disk-shaped portion and a second disk-shaped portion spaced from each other and coupled together by a conductive line that extends from the first disk-shaped portion to the second disk-shaped;
a third disk-shaped portion and a fourth disk-shaped portion in the third insulating layer and on the second insulating layer, the third disk-shaped portion and the fourth disk-shaped portion are conductive, the third disk-shaped portion overlaps the first disk-shaped portion, and the fourth disk-shaped portion overlaps the second disk-shaped portion, the third disk-shaped portion is capacitively coupled to the first disk-shaped portion without physically contacting the first disk-shaped portion, and the fourth disk-shaped portion is capacitively coupled to the second disk-shaped portion without physically contacting the second disk-shaped portion;
a first conductive through via extends into the third insulating layer to the third disk-shaped portion; and
a second conductive through via extends into the third insulating layer to the fourth disk-shaped portion;
a first die, fixed to the first face of the support, the first die having a first surface having a first die contact region;
a first contact region arranged on the first face of the support and coupled to the first conductive through via;
a first bump region couples the first contact region to the first die contact region;
a second die, fixed to the first face of the support, the second die having a first surface having a second die contact region;
a second contact region arranged on the first face of the support and coupled to the second conductive through via;
a second bump region couples the second contact region to the second die contact region;
a first external connection region and a second external connection region are spaced from each other by a distance in a first direction, the buried conductive region being between the first external connection region and the second external connection region; and
an insulating material enclosing the first die, the second die, the first die contact region, the second die contact region, the first bump region, the second bump region, the first contact region, and the second contact region and, at least partially, the support.

2. The device according to claim 1, wherein the conductive line is integral the first disk-shaped portion and the second disk-shaped portion.

3. The device according to claim 1, wherein the first disk-shaped portion and the third disk-shaped portion have a first diameter, and the second disk-shaped portion and the fourth disk-shaped portion have a second diameter.

4. The device according to claim 1, wherein the first die contact region overlaps the first disk-shaped portion and the third disk-shaped portion, and the second die contact region overlaps the second disk-shaped portion and the fourth disk-shaped portion.

5. The device according to claim 1, wherein the first and the second external connection regions are at the second face of the support, and wherein a distance between the buried conductive region and the first face of the support is equal to or smaller than a distance between the buried conductive region and at least one of the first and second external connection regions.

6. The device according to claim 1, wherein the first and second external connection regions extend on the second face of the support at a first distance.

7. The device according to claim 6, wherein the first and second dice are arranged at a second distance, wherein the first distance is greater than the second distance.

8. The device according to claim 6, wherein the first and second dice are arranged at a second distance, wherein the first distance is smaller than the second distance.

9. The device according to claim 6, wherein:
the first bump region, contiguous to the first contact region and to the first die contact region; and
the second bump region, contiguous to the second contact region and to the second die contact region.

10. The device according to claim 9, wherein a second distance between the buried conductive region and the first face of the support is equal to or smaller than a third distance between the buried conductive region and the first external connection region.

11. The device of claim 1, further comprising:
a connection pad on the support; and
a connection wire coupled to the connection pad and to at least one of the first and second external connection regions, the connection wire couples at least one of the first and second die to at least one of the first and second external connection regions.

12. The device of claim 1, further comprising:
a third contact region arranged on the first face of the third insulating layer of the support;
a third bump region couples the third contact region to a third die contact region of the first die spaced apart from the first die contact region of the first die;
a fourth contact region arranged on the first face of the third insulating layer of the support; and
a fourth bump region coupled the fourth contact region to a fourth die contact region of the second die spaced apart from the second die contact region of the second die.

13. The device of claim 12, wherein:
the third contact region is coupled to the first external connection region; and
the fourth contact region is coupled to the second external connection region.

14. The device of claim 13, further comprising:
a third via coupling the third contact region to the first external connection region by extending through the first, second, and third insulating layers from the first external connection region to the third contact region; and
a fourth via coupling the fourth contact region to the second external connection region by extending through the first, second, and third insulating layers from the second external connection region to the fourth contact region.

15. A device, comprising:
an electrical connection structure including:
a first insulating layer;
a second insulating layer on the first insulating layer;
a third insulating layer on the second insulating layer and separated from first insulating layer by the second insulating layer;
a first surface of the first insulating layer;
a second surface of the third insulating layer opposite to the first surface and facing away from the first surface; and
a buried conductive region on the first insulating layer and within the second insulating layer, the buried conductive region including:
a first end and a second end opposite to the first end;
a first disk-shaped portion at the first end;
a second disk-shaped portion at the second end; and
a connection line directly couples the first disk-shaped portion to the second disk-shaped portion by extending from the first disk-shaped portion to the second disk-shaped portion;
a third disk-shaped portion of a conductive material in the third insulating layer and on the second insulating layer, the third disk-shaped portion is aligned with and overlaps the first disk-shaped portion, the third disk-shaped portion is capacitively coupled to the first disk-shaped portion without physically contacting the first disk-shaped portion, and the third disk-shaped portion and the first disk-shaped portion separated by the second insulating layer;
a fourth disk-shaped portion of a conductive material in the third insulating layer and on the second insulating layer, the fourth disk-shaped portion is aligned with and overlaps the second disk-shaped portion, the fourth disk-shaped portion is capacitively coupled to the second disk-shaped portion without physically contacting the second disk-shaped portion, and the fourth disk-shaped portion and the second disk-shaped portion are separated by the second insulating layer;
a first contact region at the second surface of the third insulating layer;
a second contact region at the second surface of the third insulating layer and spaced apart from the first contact region;
a first via coupled to the first contact region, the first via extends into the third insulating layer to the third disk-shaped portion to electrically couple the first contact region to the third disk-shaped portion;
a second via coupled to the second contact region, the second via extends into the third insulating layer to the fourth disk-shaped portion to electrically coupled the second contact region to the fourth disk-shaped portion;
a first die stacked on the electrical connection structure and coupled to the first contact region by a first bump region, and the first die is spaced apart from the second surface of the third insulating layer by the first bump region; and
a second die stacked on the electrical connection structure and coupled to the second contact region by a second bump region, the second die is spaced apart from the second surface of the third insulating layer by the second bump region, and the second die is spaced apart from the first die.

16. The device according to claim 15, further comprising:
a first external connection region on the first surface of the first insulating layer;
a second external connection region on the first surface of the first insulating layer and spaced apart from the first external connection region;
a third contact region at second surface of the third insulating layer and spaced apart from the first contact region and the second contact region;
a fourth contact region at the second surface of the third insulating layer and spaced apart from the first contact region, the second contact region, and the third contact region;
a third via coupled to the third contact region, the third via extending from the third contact region to the first external connection region;
a fourth via coupled to the fourth contact region, the fourth via extending from the fourth contact region to the second external connection region;
a third bump region coupled to the third contact region and to the first die; and
a fourth bump region coupled to the fourth contact region and to the second die.

17. The device of claim 15, further comprising a packaging mass enclosing the first die, the second die, the first bump region, the second bump region, and, at least partially, the electrical connection structure.

18. A device, comprising:
a support including an insulating substrate having:
a first face and a second face opposite to the first face;
a first insulating layer including the second face;
a second insulating layer on the first insulating layer;
a third insulating layer on the second insulating layer including the first face;
a buried conductive region within the second insulating layer including a first disk-shaped portion and a second disk-shaped portion spaced from each other and coupled together by a conductive line that extends from the first disk-shaped portion to the second disk-shaped;
a third disk-shaped portion and a fourth disk-shaped portion in the third insulating layer and on the second insulating layer, the third disk-shaped portion and the fourth disk-shaped portion are conductive, the third disk-shaped portion overlaps the first disk-shaped portion, and the fourth disk-shaped portion overlaps the second disk-shaped portion, the third disk-shaped portion is capacitively coupled to the first disk-shaped portion without physically contacting the first disk-shaped portion, and the fourth disk-shaped portion is capacitively coupled to the second disk-shaped portion without physically contacting the second disk-shaped portion;
a first conductive through via extends into the third insulating layer to the third disk-shaped portion; and
a second conductive through via extends into the third insulating layer to the fourth disk-shaped portion;
a first die, fixed to the first face of the support, the first die having a first surface having a first die contact region;
a first contact region arranged on the first face of the support and coupled to the first conductive through via;
a first bump region couples the first contact region to the first die contact region;
a second die, fixed to the first face of the support, the second die having a first surface having a second die contact region;
a second contact region arranged on the first face of the support and coupled to the second conductive through via;
a second bump region couples the second contact region to the second die contact region;

a first external connection region and a second external connection region are spaced from each other by a distance in a first direction, the buried conductive region being between the first external connection region and the second external connection region;

an insulating material enclosing the first die, the second die, the first die contact region, the second die contact region, the first bump region, the second bump region, the first contact region, and the second contact region and, at least partially, the support; and a pad region on the first face of the support, the pad region is coupled to at least one of the first contact region and the second contact region.

19. The device of claim 18, wherein the pad region is coupled to both the first contact region and the second contact region.

20. The device of claim 18, further comprising a connection wire coupling the pad region to at least one of the first and second external connection regions.

* * * * *

UNITED STATES PATENT AND TRADEMARK OFFICE
CERTIFICATE OF CORRECTION

| | | |
|---|---|---|
| PATENT NO. | : 12,354,998 B2 | Page 1 of 1 |
| APPLICATION NO. | : 17/580480 | |
| DATED | : July 8, 2025 | |
| INVENTOR(S) | : Dario Paci et al. | |

It is certified that error appears in the above-identified patent and that said Letters Patent is hereby corrected as shown below:

In the Claims

<u>Column 14, Claim 18, Line 36:</u>
"second disk-shaped;"
Should read:
--second disk-shaped portion;--.

Signed and Sealed this
Thirtieth Day of September, 2025

John A. Squires
*Director of the United States Patent and Trademark Office*